US012738769B2

(12) United States Patent
Hisano et al.

(10) Patent No.: US 12,738,769 B2
(45) Date of Patent: Sep. 15, 2026

(54) CONTACTLESS POWER FEEDER

(71) Applicant: Daifuku Co., Ltd., Osaka (JP)

(72) Inventors: Takeshi Hisano, Hinocho (JP); Kousei Noma, Hinocho (JP); Reiya Suzuki, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 0 days.

(21) Appl. No.: 19/173,375

(22) Filed: Apr. 8, 2025

(65) Prior Publication Data

US 2025/0317010 A1 Oct. 9, 2025

(30) Foreign Application Priority Data

Apr. 9, 2024 (JP) ................................ 2024-062843

(51) Int. Cl.

| | |
|---|---|
| ***H02J 50/40*** | (2016.01) |
| ***B60M 7/00*** | (2006.01) |
| ***B61B 3/02*** | (2006.01) |
| ***B61C 13/04*** | (2006.01) |
| ***H02J 50/10*** | (2016.01) |
| ***H02J 50/70*** | (2016.01) |
| ***H10P 72/30*** | (2026.01) |

(52) U.S. Cl.
CPC ............... *H02J 50/40* (2016.02); *B60M 7/00* (2013.01); *H02J 50/10* (2016.02); *H02J 50/70* (2016.02); *H10P 72/3216* (2026.01); *B61B 3/02* (2013.01); *B61C 13/04* (2013.01); *H10P 72/3221* (2026.01)

(58) Field of Classification Search
CPC . H02J 50/40; H02J 50/10; H02J 50/70; H10P 72/3216; H10P 72/3221; B60M 7/00; B61B 3/02; B61C 13/04
See application file for complete search history.

(56) References Cited

U.S. PATENT DOCUMENTS

| | | | | |
|---|---|---|---|---|
| 7,109,602 B2 * | 9/2006 | Nishino | .................. | H02J 50/40 307/17 |
| 7,733,676 B2 * | 6/2010 | Nunoya | ................ | H02M 5/458 191/10 |
| 2013/0009475 A1 * | 1/2013 | Nunoya | .................. | H02J 50/50 307/43 |

FOREIGN PATENT DOCUMENTS

| | | |
|---|---|---|
| JP | 200267747 A | 3/2002 |

* cited by examiner

*Primary Examiner* — Carlos Amaya
(74) *Attorney, Agent, or Firm* — The Webb Law Firm

(57) ABSTRACT

A contactless power feeder including multiple feed lines includes a coupler disposed between a first feed line and a second feed line adjacent to each other and holding a first section and a second section of each of the first feed line and the second feed line facing each other. The first feed line and the second feed line are arranged in the coupler to cause a direction of a current through the first section of the second feed line relative to a direction of a current through the first section of the first feed line to be opposite to a direction of a current through the second section of the second feed line relative to a direction of a current through the second section of the first feed line.

7 Claims, 13 Drawing Sheets

100
1
2
3
5

Fig.4
5s
5p
5
3p
Ip
Is
3s
10
H
3
3
Fig.5
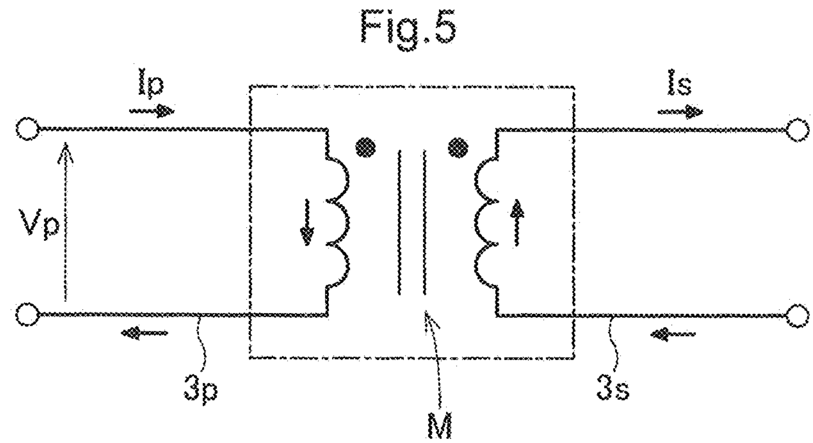
Fig.6
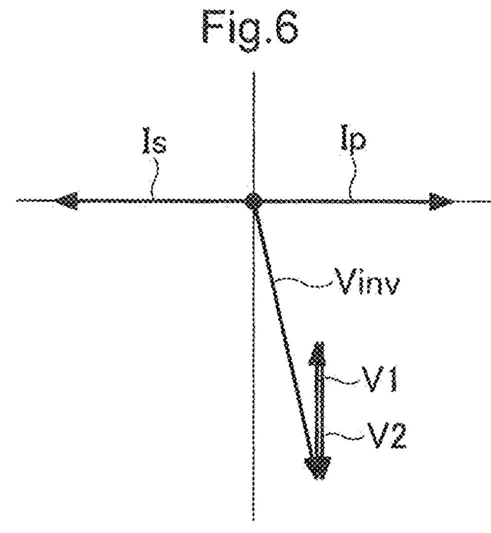

31
M1
Ip
Is
3p
3s
Vp
32
M2

Fig.18 to Capacitive to Inductivity to Resistance

CONTACTLESS POWER FEEDER

CROSS-REFERENCE TO RELATED APPLICATION

This application claims priority to Japanese Patent Application No. 2024-062843 filed Apr. 9, 2024, the disclosure of which is hereby incorporated by reference in its entirety.

BACKGROUND OF THE INVENTION

Field of the Invention

The present invention relates to a contactless power feeder.

Description of Related Art

Japanese Unexamined Patent Application Publication No. 2002-67747 describes a power supply system (contactless power feeder) including multiple induction lines (47), or feed lines through which alternating current flows, along a travel path for a movable body (V) to supply power contactlessly to the movable body (V). In the background, reference signs in parentheses are the reference signs in the above literature. The multiple induction lines (47) are connected to power supplies (inverters (M)) for supplying power to the induction lines (47). The movable body (V) including a power receiver (pickup coil (5)) travels with power supplied contactlessly from the respective induction lines (47) while switching between the multiple induction lines (47). To travel smoothly, the movable body (V) is to be stably powered at interconnections between the induction lines (47). Any phase difference between the currents flowing through adjacent induction lines (47) at an interconnection can cause transmission of power (interference power) between the induction lines (47), decreasing or increasing the voltage in one of the adjacent induction lines (47). The decreased voltage may cause inappropriate power feeding to the movable body (V). The increased voltage may exceed the rated voltage of the power supply (inverter (M)), followed by abnormalities. The alternating currents through adjacent induction lines (47) are thus to be synchronized. The power supply system includes a synchronization system.

In the power supply system, each power supply (inverter (M)) is connected to an optical transmitter (51). The optical transmitter (51) connected to a specific inverter (M) outputs a clock pulse signal that specifies electrical characteristics such as the frequency of the alternating current fed from the inverter (M) to the induction line (47). The clock pulse signal is transmitted parallelly to the other inverters (M) through the optical transmitters (51) connected to the respective other inverters (M). Based on the transmitted clock pulse signal, the other inverters (M) output, to the respective induction lines (47) connected to the inverters (M), alternating current synchronized with the alternating current output from the specific inverter (M) that has output the clock pulse signal. This synchronizes the alternating currents flowing through the multiple induction lines (47) and allows the movable body (V) to be stably powered while switching between the multiple induction lines (47). The movable body (V) can thus travel smoothly.

The power supply system including the synchronization system as described above includes synchronization control circuits for synchronization. A large system including multiple induction lines uses many synchronization control circuits, increasing the circuit size and installation space. Further, the clock pulse signal for synchronization is transmitted by the optical transmitter described as above or a wired local area network (LAN) device. This involves longer optical cables or LAN cables in total, increasing the cost and the installation space of the cables. The power supply system is thus designed to balance cost and efficiency. As described above, the issues at the interconnections include the power feeding to the movable body and the interference power. The movable body may be smoothly powered by including multiple power receiver circuits at its front and rear positions in the travel direction or including a battery or a capacitor to accommodate a temporary voltage decrease. However, the interference power may be unavoidable when the currents have a phase difference.

SUMMARY OF THE INVENTION

In response to the above, contactless power feeders including multiple feed lines with reduced interference power between adjacent feed lines are to be developed using systems with simpler structures than known systems.

A contactless power feeder in response to the above is a contactless power feeder for supplying power contactlessly to a power receiver included in a movable body. The contactless power feeder includes a plurality of feed lines aligned along a travel path for the movable body and including a first feed line and a second feed line adjacent to the first feed line along the travel path, a plurality of power supplies each connected to a corresponding feed line of the plurality of feed lines to supply alternating current to the corresponding feed line, and a coupler disposed between the first feed line and the second feed line and holding the first feed line and the second feed line. The coupler holds a first section and a second section of each of the first feed line and the second feed line facing each other. The first feed line and the second feed line are arranged in the coupler to cause a direction of a current through the first section of the second feed line relative to a direction of a current through the first section of the first feed line to be opposite to a direction of a current through the second section of the second feed line relative to a direction of a current through the second section of the first feed line.

This structure can reduce interference power using an induced electromotive force between the first feed line and the second feed line facing each other in the coupler, although the alternating current through the first feed line has a phase shifted from the phase of the alternating current through the second feed line. This reduces the likelihood of abnormalities in the power supply connected to each feed line. Thus, the contactless power feeder with this structure may not have synchronized phases between the alternating current through the first feed line and the alternating current through the second feed line, and thus includes no synchronization system. In other words, the structure provides the contactless power feeder including multiple feed lines with reduced interference power between adjacent feed lines using systems with simpler structures than known systems. The contactless power feeder can thus be simpler and less costly.

Additional features and advantages of the contactless power feeder are apparent from the exemplary and non-limiting embodiments described below with reference to the drawings.

BRIEF DESCRIPTION OF DRAWINGS

FIG. 4 is a diagram of a first feed line and a second feed line arranged in a typical coupler in an example.

FIG. 5 is an equivalent circuit diagram showing electromagnetic coupling between the first feed line and the second feed line arranged as in FIG. 4.

FIG. 6 is a vector diagram of an interference voltage with the currents being synchronized.

FIG. 18 is a set of vector diagrams of reference output voltages and mutual induction voltages for different methods performed in a power supply for adjusting impedance in a power feeder circuit.

DESCRIPTION OF THE INVENTION

A contactless power feeder according to an embodiment described below is used as a power supply system for supplying power to movable bodies that transport articles in an article transport facility. In the present embodiment, as shown in, for example, FIGS. 1 and 2, each movable body is an article transport vehicle 30 that transports an article by moving along a travel path 10 as travel rails 20 that are hung from a ceiling of a building. The article transport vehicle as the movable body is not limited to a ceiling-hung transport vehicle that travels along the ceiling, and may be a floor-traveling transport vehicle that moves along rails on a floor surface as the travel path 10, a stacker crane, or other article transport vehicles. When such an article transport vehicle includes multiple sections such as a traveler and a body, part of the article transport vehicle, or for example, the traveler alone, may correspond to the movable body, instead of the entire article transport vehicle. For example, for the article transport vehicle being a ceiling-hung transport vehicle as in the present embodiment, a traveler 12 (described later) may correspond to the movable body. For a stacker crane, a crane carrier supporting a crane may correspond to the movable body.

Figure 1:
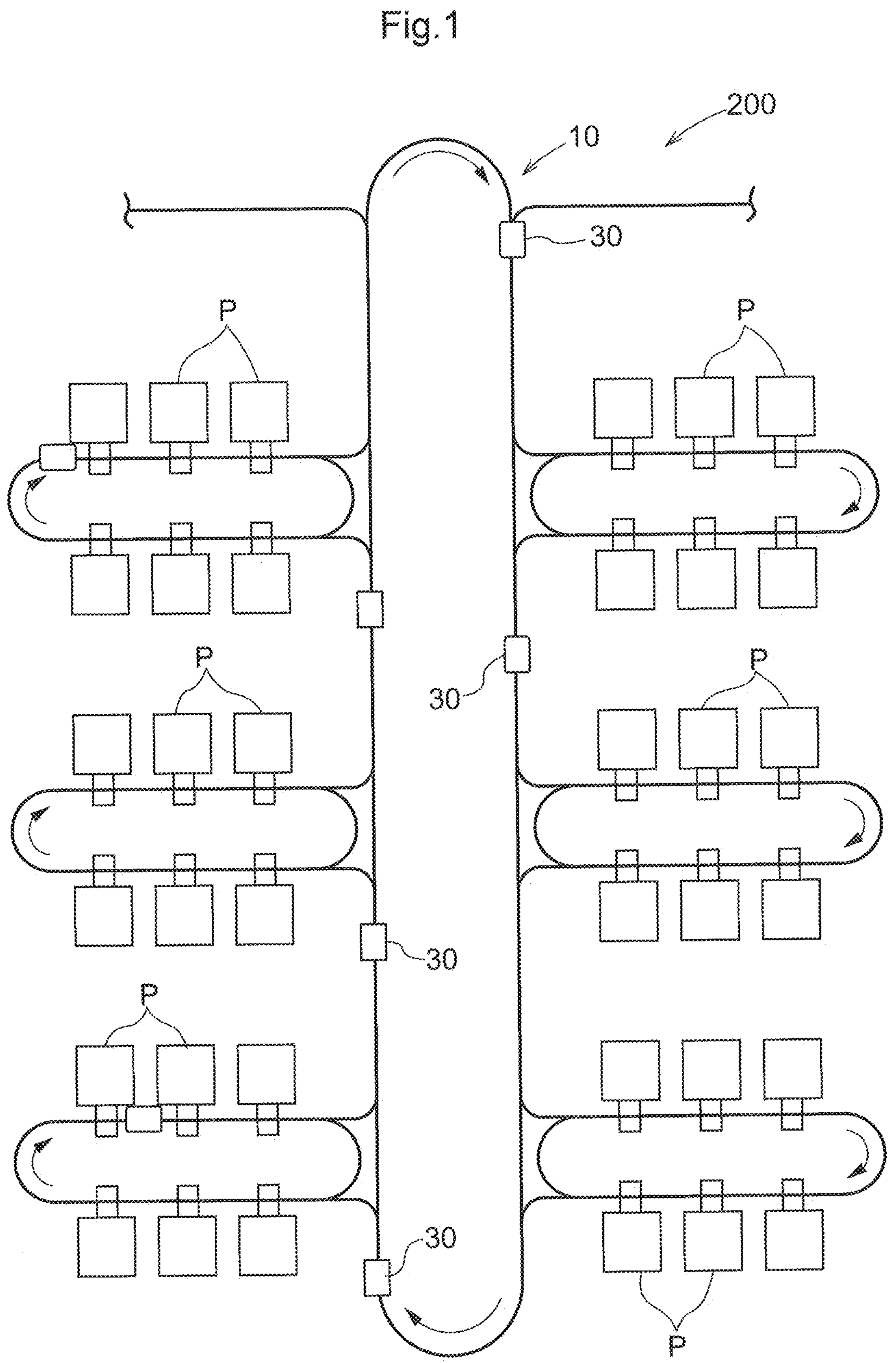
FIG. 1 is a plan view of an article transport facility including a contactless power feeder.
Figure 2:
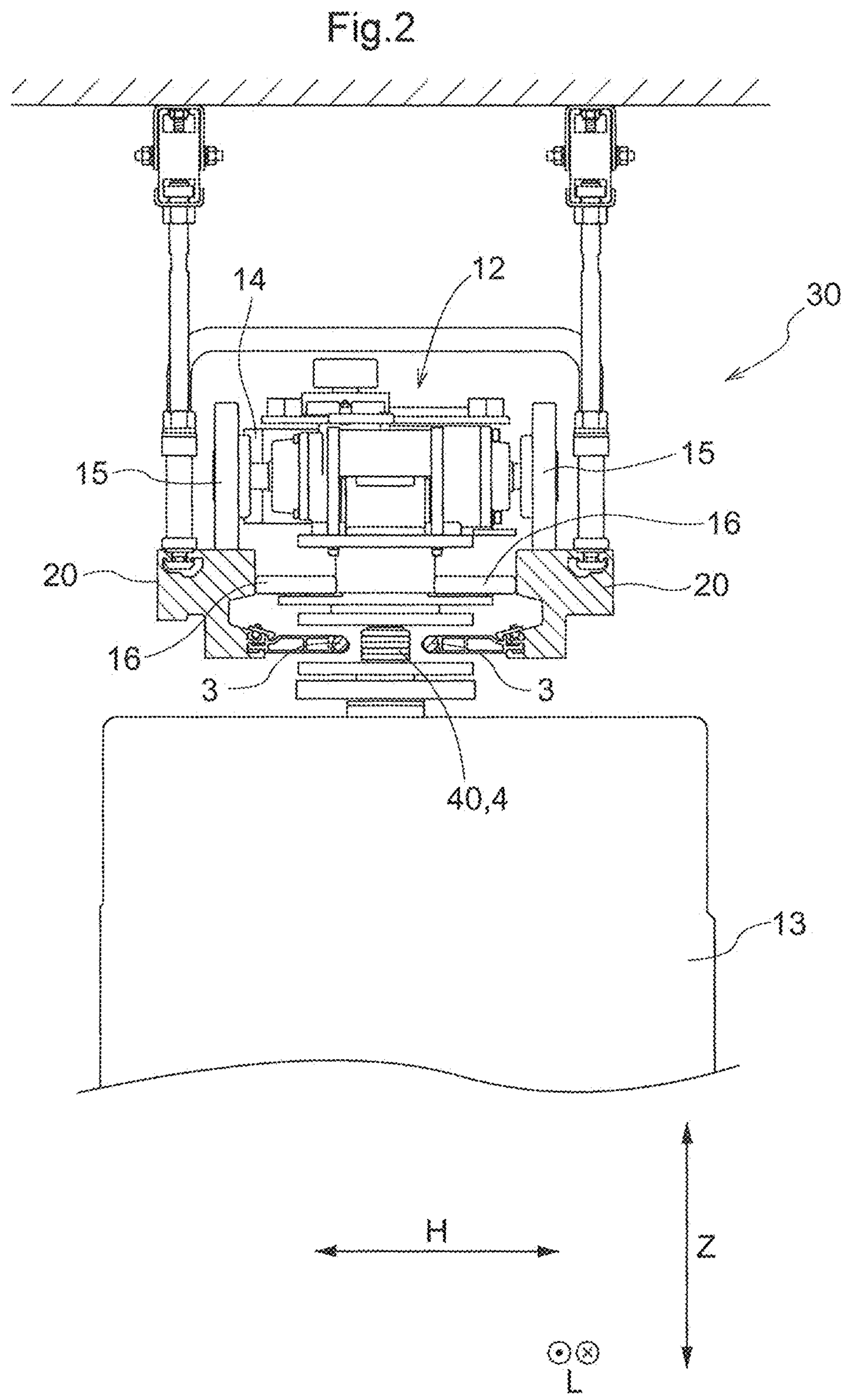
FIG. 2 is a front view of an article transport vehicle.

As shown in FIGS. 1 and 2, an article transport facility 200 in the present embodiment includes the travel rails 20 installed along the travel path 10 on which the article transport vehicle 30 travels, and the article transport vehicle 30 that travels along the travel path 10 as guided by the travel rails 20. In the present embodiment, the article to be transported by the article transport vehicle 30 is, for example, a front-opening unified pod (FOUP) containing semiconductor substrates or a glass substrate for a display. The article transport facility 200 also includes a storage (not shown) for semiconductor substrates, and article processors P for performing various processes on the semiconductor substrates, such as forming circuitry.

Figure 3:
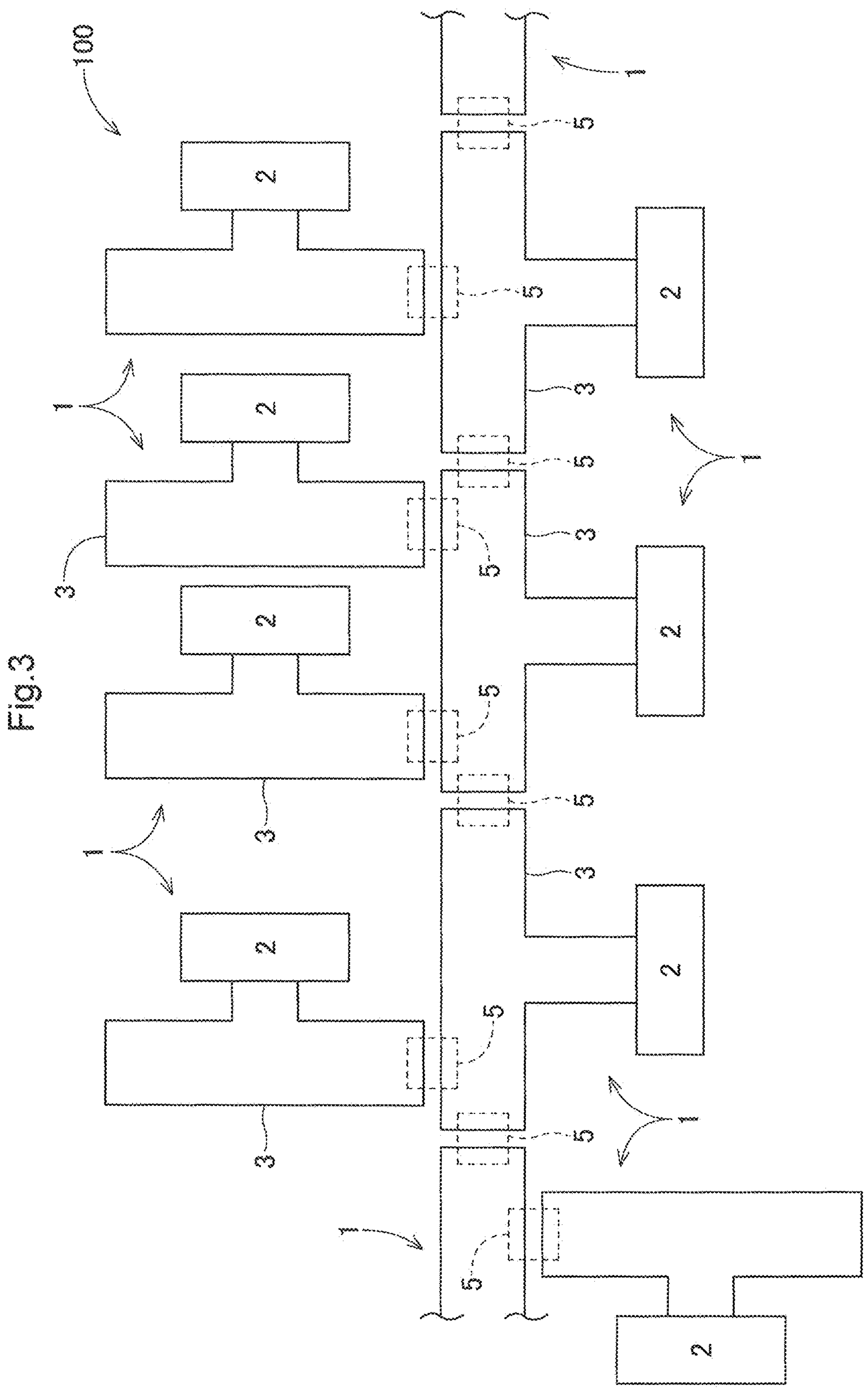
FIG. 3 is a schematic block diagram of the contactless power feeder showing its system configuration.

In the present embodiment, as shown in FIG. 2, the article transport vehicle 30 includes a traveler 12, a body 13, and a power receiver 4. The traveler 12 travels along the travel path 10 as guided by the travel rails 20 as a pair hung from the ceiling along the travel path 10. The body 13 is below the travel rails 20 and hung from the traveler 12. The power receiver 4 receives driving power contactlessly from feed lines 3 installed along the travel path 10. In the present embodiment, the feed lines 3 as a pair form a closed circuit as shown in FIG. 3 along the pair of travel rails 20. Although not shown or described in detail, the body 13 includes an article support that is raised or lowered to support an article being hung. The article transport vehicle 30 corresponds to the movable body as described above. More specifically, however, the traveler 12 may correspond to the movable body.

As shown in FIG. 2, the traveler 12 includes a pair of travel wheels 15 that are rotated by an electric drive motor 14. The travel wheels 15 roll on travel surfaces defined on the upper surfaces of the travel rails 20. The traveler 12 includes a pair of guide wheels 16 in contact with the inner surfaces of the pair of travel rails 20. Each guide wheel 16 freely rotates about an axis extending in the vertical direction Z (vertical axis). The traveler 12 includes, for example, the drive motor 14 for traveling and a drive circuit for the drive motor 14 to allow the article transport vehicle 30 to travel on the travel rails 20. The body 13 includes, for example, an actuator for raising and lowering the article support, an actuator for driving grippers for gripping articles, and drive circuits for these actuators. The drive motor 14, the actuators, and the drive circuits each correspond to an electric load in the article transport vehicle 30.

The article transport facility 200 includes a facility controller (not shown) that transmits a transportation command to the article transport vehicle 30 to transport an article. In response to the transportation command, the article transport vehicle 30 travels autonomously to, for example, transfer and receive an article between an article processor P and the article transport vehicle 30, and transports an article between an article processor P and the storage described above (not shown).

Power for the drive motor 14, various actuators, and the drive circuits for these components is supplied contactlessly to the power receiver 4 from the feed lines 3. As described above, the feed lines 3, which supply driving power to the article transport vehicle 30 through the power receiver 4, are installed along the travel path 10. In the present embodiment, the feed lines 3 are disposed on both sides of the power receiver 4 in a path width direction H perpendicular to a path direction L along the travel path 10 (perpendicular to both the path direction L and the vertical direction Z in this example).

The power receiver 4 includes a pair of pickup coils 40 (refer to FIG. 2) arranged in the article transport vehicle 30 to face the feed lines 3, and a power receiver circuit on a wiring board inside the article transport vehicle 30. As described later, a power supply 2 feeds a high-frequency current to the feed lines 3 as induction lines and generates a magnetic field around the feed lines 3. The pickup coils 40 generate an induced electromotive force with alternating current flowing through the feed lines 3. The pickup coils 40 are electrically connected to the power receiver circuit, which is connected to the electric loads.

Although not shown or described in detail, the power receiver circuit includes, for example, part of a resonator circuit including the pickup coils 40 and the power receiver circuit, a rectifier circuit, and a power adjuster circuit such as a chopper circuit or a regulator circuit. The rectifier circuit is connected to the pickup coils 40 (connected to the resonator circuit) to rectify the alternating current and the alternating current voltage induced by the pickup coils 40 to direct current and a direct current voltage. At least one of an output portion for the rectifier circuit and an output portion for the power adjuster circuit includes a smoothing capacitor for smoothing a pulsating component.

A contactless power feeder 100 according to the present embodiment uses a wireless power feed technique to supply driving power to the electric loads in the article transport vehicle 30. As shown in FIG. 3, the contactless power feeder 100 includes the feed lines 3 and power supplies 2 connected to the feed lines 3 to supply alternating current to the feed lines 3. Although not shown or described in detail, each power supply 2 is connected to a power source such as a utility power supply. Each power supply 2 includes a power converter circuit such as a converter or an inverter, and a power adjuster circuit. The power supplies 2 adjust the output as appropriate for the electric load (including the consumption in the article transport vehicle 30 and the consumption or loss in the feed lines) that receives power through the feed lines 3, and supply power to the feed lines 3. The power supplies 2 stably supply power with a constant voltage to the feed lines 3 within their adjusting capability. The power supplies 2 feed a high-frequency current to the feed lines 3 as induction lines and generate magnetic fields around the feed lines 3. As illustrated in FIG. 1, the article transport facility 200 in the present embodiment is relatively large. To avoid decreased efficiency in power transmission or stoppages of the entire facility upon failure, the contactless power feeder 100 includes multiple power feeding systems 1, rather than a single power feeding system 1, each including the feed line 3 and the power supply 2, as shown in FIG. 3. One power feeding system 1 supplies power to multiple article transport vehicles 30.

Each article transport vehicle 30 switches between multiple power feeding systems 1 to continuously receive power and travel in the article transport facility 200. As shown in FIGS. 3 and 4, the contactless power feeder 100 includes couplers 5 at interconnections between the power feeding systems 1, or in other words, between the feed lines 3. Each coupler 5 holds the feed lines 3 in adjacent power feeding systems 1 at a constant distance from each other. The feed lines 3 and the power supply 2 in one power feeding system 1 form a closed circuit. In one power feeder system 1, the feed lines 3 are arranged on both sides of the travel path 10 in the path width direction H as the pair of feed lines 3 that are an outgoing path and a return path. To form the closed circuit, the pair of feed lines 3 cross the travel path 10 in the path width direction H. As shown in FIG. 4, the coupler 5 holds the feed lines 3 arranged in the path width direction H to avoid obstructing movement of the article transport vehicle 30.

More specifically, the coupler 5 holds the pair of feed lines 3 (collectively referred to as a first feed line **3*p*) forming the closed circuit in a first power feeding system 1 and the pair of feed lines 3 (collectively referred to as a second feed line 3*s*) in a second power feeding system 1 adjacent to the first power feeding system 1 to place the first feed line 3*p* crossing the pair of travel rails 20 at a position close to the second feed line pair 3*s*. As shown in FIG. 4, the coupler 5 includes a first portion 5*p* holding the first feed line 3*p* and a second portion 5*s* holding the second feed line 3*s*. The first portion 5*p* and the second portion 5*s* are close to each other to avoid disconnection between the feed lines 3 when the article transport vehicle 30 switches between the power feeding systems 1**.

To travel smoothly, the article transport vehicle 30 may be stably powered at the interconnections between the power feeding systems 1, or in other words, between the feed lines 3. For example, the alternating currents in the multiple power feeding systems 1 may be adjusted to be in phase to allow the article transport vehicle 30 to receive power continuously from the multiple feeder systems 1 and autonomously travel in the article transport facility 200. In the configuration shown in FIG. 4, the current (first current Ip) through the first feed line **3*p* is to be in phase with the current (second current Is) through the second feed line 3*s***. More specifically, the first current Ip is to be synchronized with the second current Is.

The equivalent circuit in FIG. 5 schematically shows electromagnetic coupling between the first feed line **3*p* and the second feed line 3*s* in the coupler 5, with the first current Ip synchronized with the second current Is. As shown in FIG. 4, the first current Ip and the second current Is through the respective feed lines 3 along the travel path 10 are synchronized to flow in the same direction and are in phase. The first current Ip and the second current Is are thus out of phase in the coupler 5. In this state, the voltage (first induction voltage Vp) for the first feed line 3*p* induced by the electromagnetic coupling is expressed by Formula 1 below, where M is a mutual inductance between the first feed line 3*p* and the second feed line 3*s* in the coupler 5. Formula 1 is defined based on a modified T-topology circuit, as described further with reference to FIG. 19. The modified T-topology circuit (the lower circuit in FIG. 19) is modified from a T-topology circuit (the middle circuit in FIG. 19) representing a typical equivalent circuit (the upper circuit in FIG. 19) corresponding to the equivalent circuit in FIG. 5. As described later with reference to FIG. 19, V1 is a voltage induced by self-inductance of the first feed line 3*p* (self-induction voltage) in the coupler 5, and V2 is a voltage induced by the mutual inductance M described above (mutual induction voltage) in the coupler 5**.

$$\mathrm{Vp} = j\omega M \cdot Ip - j\omega M \cdot Is = \mathrm{V1} - \mathrm{V2} \tag{1}$$

As shown in the vector diagram in FIG. 6, the self-induction voltage V1 has a phase leading by 90 degrees from the phase of the first current Ip, and the mutual induction voltage V2 has a phase leading by 90 degrees from the phase of the second current Is. When the first current Ip and the second current Is are synchronized, the first current Ip and the second current Is in the coupler 5 flow in opposite directions, differing in phase by 180 degrees. The self-induction voltage V1 and the mutual induction voltage V2 thus also differ in phase by 180 degrees, thus having opposite vectors to cancel each other, as shown in FIG. 6.

In the vector diagram in FIG. 6, Vinv is an output voltage (reference output voltage) of the power supply 2 that supplies power to the first feed line 3*p*. The self-induction voltage V1 and the mutual induction voltage V2 cancel each other and thus do not affect the reference output voltage Vinv. Similarly, although not shown, the self-induction voltage V1 and the mutual induction voltage V2 do not affect (do not interfere with) the reference output voltage of the power supply 2 that supplies power to the second feed line 3*s*.

Figure 7:
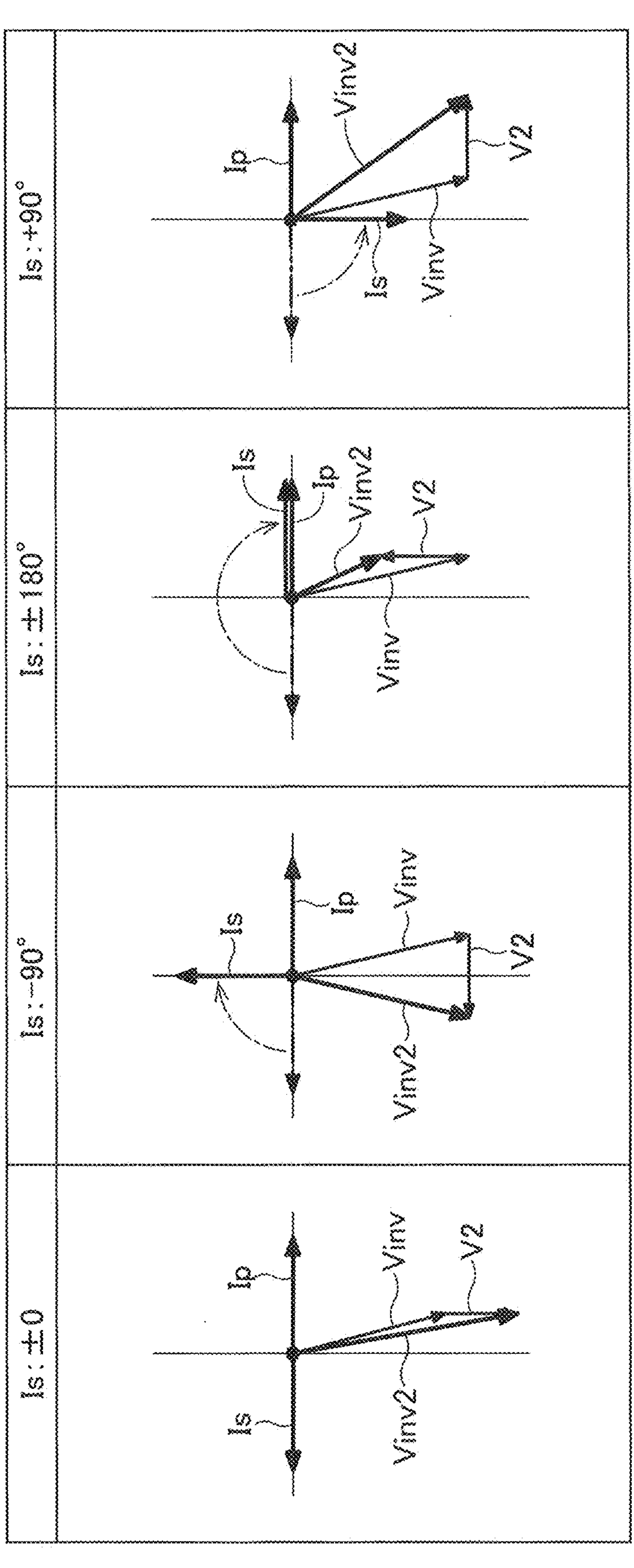
FIG. 7 is a set of vector diagrams of interference voltages, each with the phase of the current shifted by 90 degrees.

The effects of the first induction voltage Vp, particularly, the mutual induction voltage V2, on the reference output voltage will now be described, including the effects produced when the first current Ip and the second current Is are not synchronized. FIG. 7 is a set of vector diagrams in each of which the second current Is has a phase shifted by 90 degrees from the phase of the second current Is in synchronization with the first current Ip (synchronization phase). The effects of the mutual induction voltage V2 on the reference output voltage will be particularly described below. Thus, the self-induction voltage V1 in the diagrams is included in the reference output voltage Vinv of the power supply 2. More specifically, the reference output voltage Vinv in FIG. 7 is equivalent to a composite vector of the reference output voltage Vinv and the self-induction voltage V1 in FIG. 6. In this case, the mutual induction voltage V2 based on the mutual inductance M can be an interference voltage that affects the reference output voltage Vinv (the power supply 2 for the first feed line 3*p*). In FIG. 7, a voltage Vinv2 is an output voltage after the interference voltage is compensated by the power supply 2 (compensated output voltage).

In FIG. 7, a vector diagram Is: ±0 shows the second current Is with no phase difference from the synchronization phase, or more specifically, the second current Is in synchronization with the first current Ip. In other words, the vector diagram Is: ±0 shows the same state as in FIG. 6. When the first current Ip and the second current Is are synchronized, the mutual induction voltage V2 has a phase lagging by 90 degrees from the first current Ip. Thus, the mutual induction voltage V2 serves as a capacitive load on the reference output voltage Vinv (the power supply 2 for the first feed line 3*p*). The power supply 2 compensates the interference voltage based also on the capacitive load to allow the output voltage to be the compensated output voltage Vinv2 that is higher than the reference output voltage Vinv. For example, the power supply 2 adjusts the duty cycle to be higher for controlling pulse width modulation on the power adjuster circuit.

In FIG. 7, a vector diagram Is: ±180° shows the second current Is with a phase shifted by 180 degrees from the synchronization phase. In this case, the first current Ip and the second current Is flow in the same direction, and the mutual induction voltage V2 has a phase leading by 90 degrees from the first current Ip. Thus, the mutual induction voltage V2 serves as an inductive load on the reference output voltage Vinv (the power supply 2 for the first feed line 3*p*). The power supply 2 compensates the interference voltage based also on the inductive load to allow the output voltage to be the compensated output voltage Vinv2 that is lower than the reference output voltage Vinv. For example, the power supply 2 adjusts the duty cycle to be lower for controlling pulse width modulation on the power adjuster circuit.

In FIG. 7, a vector diagram Is: ±90° shows the second current Is with a phase leading by 90 degrees from the synchronization phase. In this case, the first current Ip has a phase leading by 90 degrees from the phase of the second current Is, and the mutual induction voltage V2 is in phase with the first current Ip. Thus, the mutual induction voltage V2 serves as a real load (resistive load) on the reference output voltage Vinv (the power supply 2 for the first feed line 3*p*). The power supply 2 compensates the interference voltage based also on the resistive load to allow the output voltage to be the compensated output voltage Vinv2 that is higher than the reference output voltage Vinv. For example, the power supply 2 adjusts the duty cycle to be higher for controlling pulse width modulation on the power adjuster circuit.

In FIG. 7, a vector diagram Is: −90° shows the second current Is with a phase lagging by 90 degrees from the synchronization phase. In this case, the first current Ip has a phase lagging by 90 degrees from the phase of the second current Is, and the mutual induction voltage V2 has a phase shifted by 180 degrees from the phase of the first current Ip. Thus, the mutual induction voltage V2 serves as a negative real load (regenerative load) on the reference output voltage Vinv (the power supply 2 for the first feed line 3*p*). When, for example, the electric load consumes less power supplied through the first feed line 3*p*, the interference voltage beyond the imaginary axis as shown in FIG. 7 may not be compensated. This causes the compensated output voltage Vinv2 to be a negative voltage, which is regenerated for the power supply 2 for the first feed line 3*p*. The regenerated power may cause abnormalities in the power supply 2, such as an overvoltage.

In the example described above, the first feed line 3*p* is used as a feed line 3 to be analyzed (primary feed line), and the effects of the second feed line 3*s* as a secondary feed line on the primary feed line is examined. However, one power feeding system 1 may be adjacent to multiple power feeding systems 1, as shown in FIG. 3. Thus, multiple second feed lines 3*s* may affect the first feed line 3*p*. When, for example, the second current Is having a phase lagging by 90 degrees from the synchronization phase flows through most of the multiple second feed lines 3*s*, the power supply 2 connected to the first feed line 3*p* receives a greater amount of regenerated power in total. This may increase the likelihood of abnormalities in the power supply 2.

Thus, the first current Ip and the second current Is are to be synchronized. For example, a known system includes a synchronized signal transmitter and a signal transmission line for transmitting a synchronized signal to provide the synchronized signal to the multiple power supplies 2. This synchronizes the phases of the alternating currents supplied from the multiple power supplies 2 to the respective feed lines 3. Each power supply 2 can output, based on the synchronized signal, alternating current having the phase matching the phases of the alternating currents output from the other power supplies 2. However, such a signal transmitter and a signal transmission line can increase the material cost of the system and installation work-hours. Many signal transmitters included in the system can also easily increase the maintenance cost for such devices.

The contactless power feeder 100 according to the present embodiment reduces, using a simpler system than known systems, the interference power induced between adjacent feed lines 3 without synchronizing the alternating current among the multiple power feeding systems 1. More specifically, the feed lines 3 held in the coupler 5 are arranged to reduce the interference power in the coupler 5. This achieves the simple system.

Figures 8, 9:
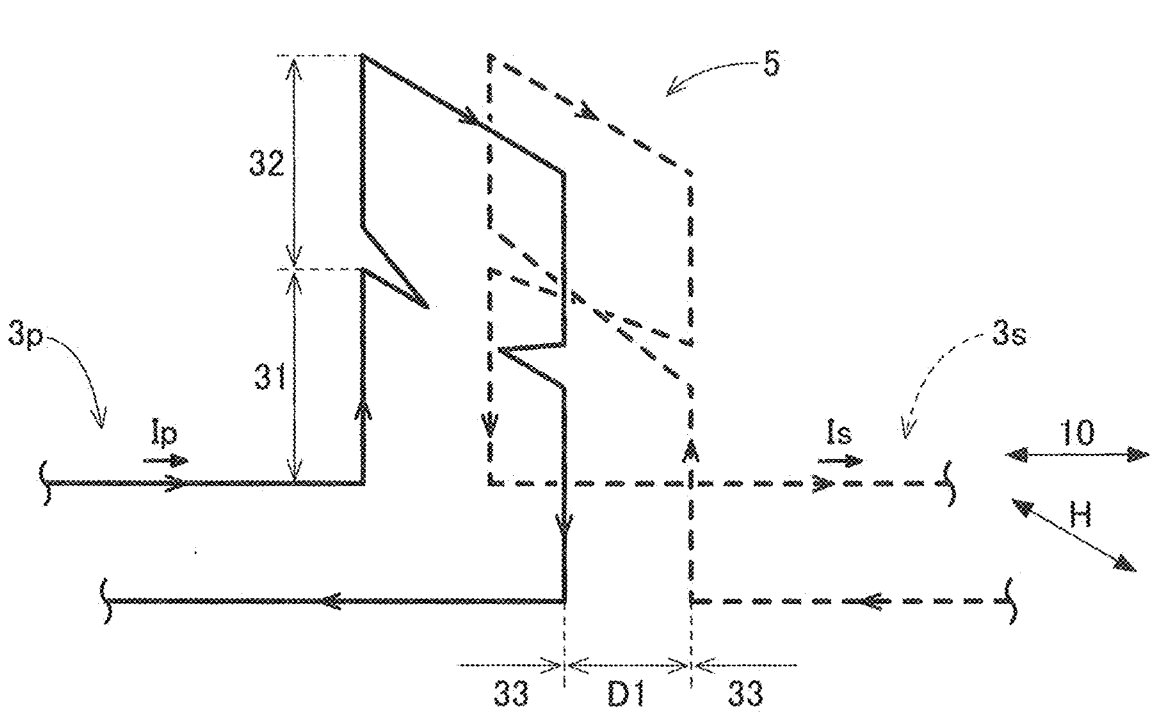
FIG. 8 is a diagram of the first feed line and the second feed line arranged in a coupler in a first example.
FIG. 9 is an equivalent circuit diagram showing electromagnetic coupling between the first feed line and the second feed line arranged as in FIG. 8.

FIG. 8 shows the first feed line 3*p* and the second feed line 3*s* arranged in the coupler 5 in a first example. As shown in FIG. 4 with a broken line, the coupler 5 has a clear positional relationship with the first feed line 3*p* and the second feed line 3*s*. Thus, the coupler 5 is not shown in FIG. 8 and subsequent figures for viewability. The equivalent circuit diagram in FIG. 9 shows electromagnetic coupling between the first feed line 3*p* and the second feed line 3*s* arranged as in FIG. 8.

As shown in FIG. 8, the contactless power feeder 100 includes the coupler 5 between a first feed line 3*p* as one of the multiple feed lines 3 and a second feed line 3*s* as a feed line 3 adjacent to the first feed line 3*p* along the travel path 10. The coupler 5 holds the first feed line 3*p* and the second feed line 3*s*. The coupler 5 holds first sections 31 and a second section 32 of each of the first feed line 3*p* and the second feed line 3*s* facing each other (parallel). In the present embodiment, the first feed line 3*p* and the second feed line 3*s* each include two first sections 31 and one second section 32 in the coupler 5. The first feed line 3*p* and the second feed line 3*s* are each held with the first section 31, the second section 32, and the first section 31 arranged in series in this order.

The first feed line 3*p* and the second feed line 3*s* are arranged in the coupler 5 to cause the direction of the second current Is through the first sections 31 of the second feed line 3*s* relative to the direction of the first current Ip through the first sections 31 of the first feed line 3*p* to be opposite to the direction of the second current Is through the second section 32 of the second feed line 3*s* relative to the direction of the first current Ip through the second section 32 of the first feed line 3*p*. In the example shown in FIG. 8, the first current Ip and the second current Is flow in opposite directions through the first sections 31 and in the same direction through the second sections 32.

As shown in FIG. 9, a first mutual inductance M1 is a mutual inductance of the first feed line 3*p* and the second feed line 3*s* in the first sections 31, and a second mutual inductance M2 is a mutual inductance of the first feed line 3*p* and the second feed line 3*s* in the second sections 32. The first induction voltage Vp expressed by Formula 1 may be expressed by Formula 2 below.

$$\mathrm{Vp} = (j\omega M1 \cdot Ip - j\omega M1 \cdot Is) + (j\omega M2 \cdot Ip + j\omega M2 \cdot Is) = j\omega(M1 + M2)Ip + j\omega(M2 - M1)Is \tag{2}$$

When the difference between M1 and M2 is smaller, the second term in the second row in Formula 2 has a lower value. When the first mutual inductance M1 matches the second mutual inductance M2, the second term is zero, and Formula 2 can be expressed by Formula 3 below.

$$\mathrm{Vp} = j\omega(M1 + M2) \cdot Ip \tag{3}$$

More specifically, the second current Is through the second feed line 3*s* does not affect the first induction voltage Vp, independently of the phase relative to the first current Ip. Thus, the second current Is does not affect the power supply 2 supplying power to the first feed line 3*p*. The contactless power feeder 100 with this structure can thus reduce, using a simpler system than known systems, the interference power between the first feed line 3*p* and the second feed line 3*s* adjacent to each other without synchronizing the first current Ip and the second current Is.

As Formula 2 and Formula 3 show, the first feed line 3*p* and the second feed line 3*s* may be arranged in the coupler 5 to cause the first mutual inductance M1 between the first sections 31 of the first feed line 3*p* and the first sections 31 of the second feed line 3*s* to be substantially equal to the second mutual inductance M2 between the second section 32 of the first feed line 3*p* and the second section 32 of the second feed line 3*s*. However, when the first mutual inductance M1 is not equal to the second mutual inductance M2 with a smaller difference from the second mutual inductance M2, the second term in the second row in Formula 2 is a low value, reducing the effects of the second current Is. A difference between the first mutual inductance M1 and the second mutual inductance M2 as small as within an error margin can reduce the effects of the second current Is to a neglectable level.

Figure 10:
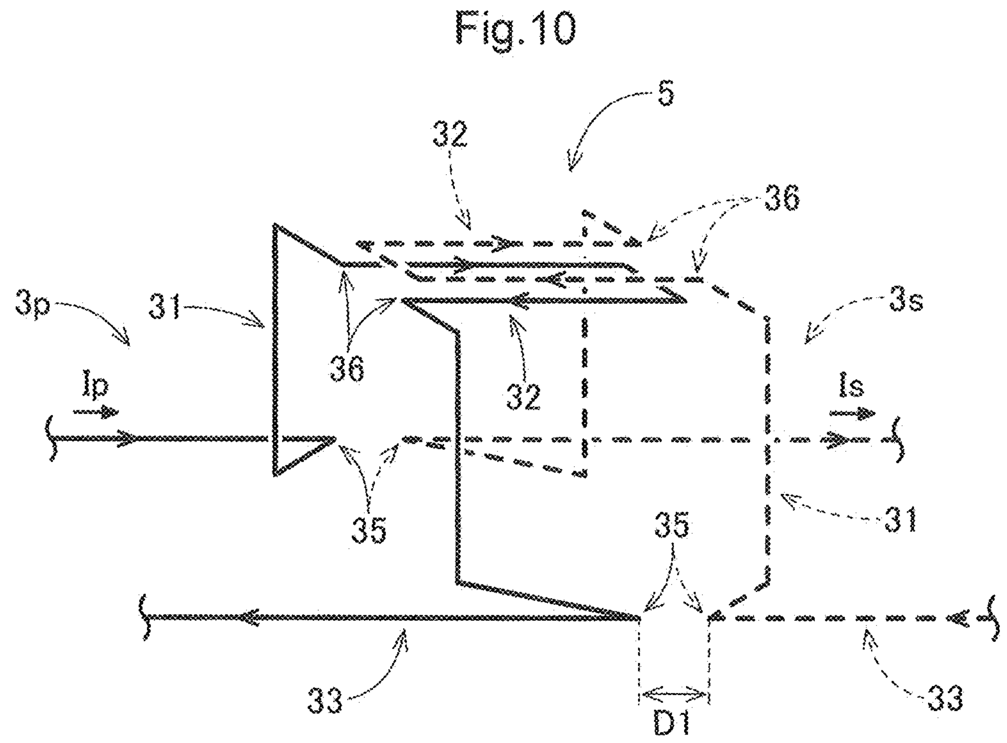
FIG. 10 is a diagram of the first feed line and the second feed line arranged in a second example.
Figure 11:
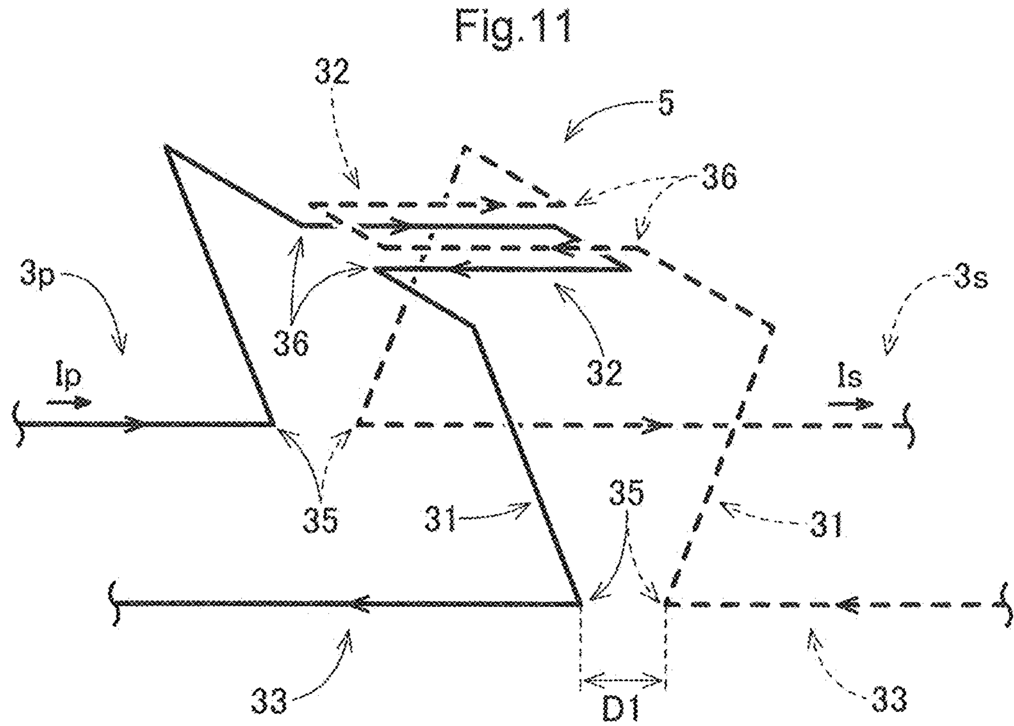
FIG. 11 is a diagram of the first feed line and the second feed line arranged in a third example.
Figure 12:
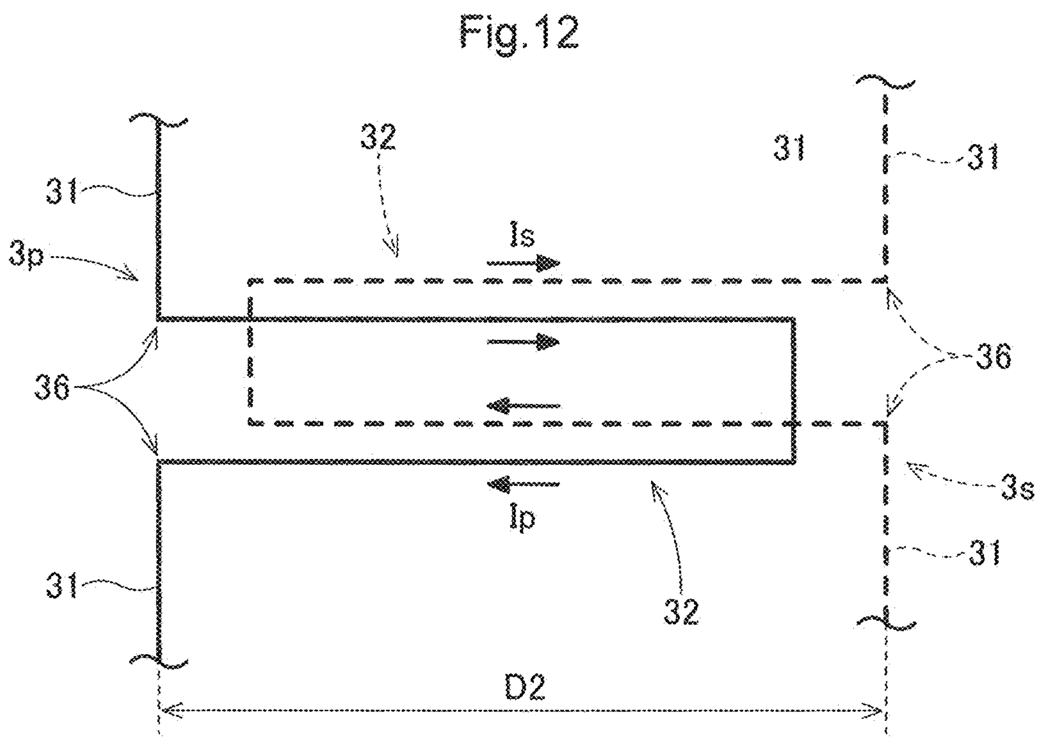
FIG. 12 is a top view of a second section in the second example and the third example.

FIG. 10 shows the first feed line 3*p* and the second feed line 3*s* arranged in a second example. FIG. 11 shows a third example. FIG. 12 is a top view of the second sections 32 in the second example and the third example. As shown in, for example, FIGS. 8, 10, and 11, each of the first feed line 3*p* and the second feed line 3*s* includes, as feed sections 33 of the corresponding feed line 3, portions extending along the travel path 10 outside the coupler 5. Each of the first feed line 3*p* and the second feed line 3*s* has the corresponding feed sections 33 directly connected to first joints 35 of the corresponding first sections 31. More specifically, the first joints 35 are the ends of the first sections 31 adjacent to the feed sections 33. Each second section 32 is connected to second joints 36 of the first sections 31. The second joints 36 are at positions different from the positions of the first joints 35, and are the ends of the first sections 31 opposite to the feed sections 33. The second section 32 is connected to the second joints 36 of the first sections 31 and connected to the feed sections 33 through the corresponding first sections 31. More specifically, the first feed line 3*p* and the second feed line 3*s* each include the feed sections 33, the first sections 31, and the second section 32 connected in series in this order. In the present embodiment, the feed lines 3 are on the opposite sides in the path width direction H, and the feed sections 33 are also on the opposite sides in the path width direction H. The first sections 31 are connected to the feed sections 33 on the opposite sides in the path width direction H. More specifically, the feed lines 3 each include one of the feed sections 33, one of the first sections 31, the second section 32, the other of the first sections 31, and the other of the feed sections 33 connected in series in this order.

To continuously supply power to the article transport vehicle 30 switching between the multiple power feeding systems 1, the feed lines 3 adjacent to one another are aligned along the travel path 10. Thus, the feed sections 33 in the first feed line 3*p* and the feed sections 33 in the second feed line 3*s* are aligned along the travel path 10. In the second example and the third example, as shown in FIGS. 10 and 11, the first feed line 3*p* and the second feed line 3*s* are arranged in the coupler 5 to allow the distance (second distance D2) between each second joint 36 in the first feed line 3*p* and each second joint 36 in the second feed line 3*s* to be larger than the distance (first distance D1) between each first joint 35 in the first feed line 3*p* and each first joint 35 in the second feed line 3*s*.

The first sections 31 extending between the respective first joints 35 and second joints 36 have the second distance D2 between the second joints 36 larger than the first distance D1 between the first joints 35. In this structure, the average of the distance between the first section 31 of the first feed line 3*p* and the first section 31 of the second feed line 3*s* is greater than in the first example shown in FIG. 8 in which the distance is substantially constant as the first distance D1.

This causes the first mutual inductance M1 in the first sections 31 to be lower than in arrangement in the first example. As described above, the first mutual inductance M1 and the second mutual inductance M2 may be substantially equal to each other. Thus, the lower first mutual inductance M1 can also decrease the second mutual inductance M2. As shown in FIGS. 10 to 12, the second section 32 of the first feed line 3*p* and the second section 32 of the second feed line 3*s* are closer to each other than the first section 31 of the first feed line 3*p* and the first section 31 of the second feed line 3*s*. The lower second mutual inductance M2 can shorten the wire length.

As shown with Formula 3 above, the second current Is can produce substantially no effect, but the first induction voltage Vp induced by the first current Ip remains. The unintended first induction voltage Vp may be minimized. Decreasing the first mutual inductance M1 can decrease the first induction voltage Vp. As described above, decreasing the first mutual inductance M1 can decrease the second mutual inductance M2, and thus M1+M2 in Formula 3 can easily decrease the first induction voltage Vp more markedly.

To smoothly and continuously feed power to the article transport vehicle 30 switching between the power feeding systems 1, the first joints 35 connected to the feed sections 33 may be close to each other. However, when the article transport vehicle 30 includes multiple (at least two) power receivers 4 spaced from each other in the front-rear direction to receive power from the feed lines 3 with at least one of the power receivers 4, the first distance DI can be increased up to the distance between the power receivers 4 spaced in the front-rear direction. In another example, the article transport vehicle 30 may include batteries or capacitors to store power to continue its operation for any temporary loss of power supply when switching between power feeding systems 1. The first distance D1 can be longer based on the storage capacity. Such a longer first distance D1 can further decrease the first mutual inductance M1.

In the first example, a plane including the first sections 31 of each feed line 3 is parallel to a plane including the second section 32 of the feed line. In this structure, the magnetic flux induced by the current flowing through the pair of feed lines as the first feed line 3*p* and the second feed line 3*s* has the same direction in the first sections 31 and the second section 32. The magnetic flux in the first sections 31 and the magnetic flux in the second section 32 can easily interfere with each other, increasing the likelihood of errors between the actual value and the design value in the first mutual inductance M1 and the second mutual inductance M2. With larger errors, the interference voltage may not be reduced effectively. As in the fourth example shown in FIG. 13 and the fifth example shown in FIG. 14, the feed lines 3 may be arranged to have the plane including the first sections 31 of the feed lines 3 perpendicular to the plane including the second sections 32 of the feed lines 3. In this structure, the magnetic fluxes are in different directions and are less likely to interfere with each other.

Figure 13:
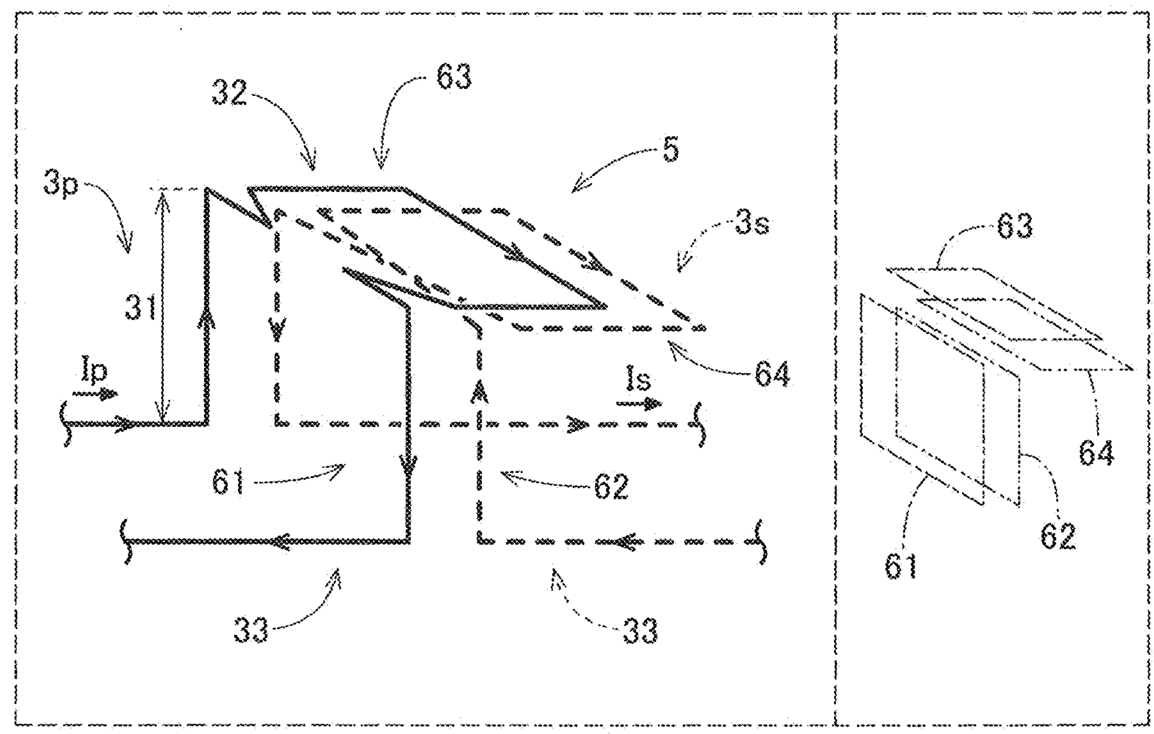
FIG. 13 is a diagram of the first feed line and the second feed line arranged in a fourth example.
Figure 14:
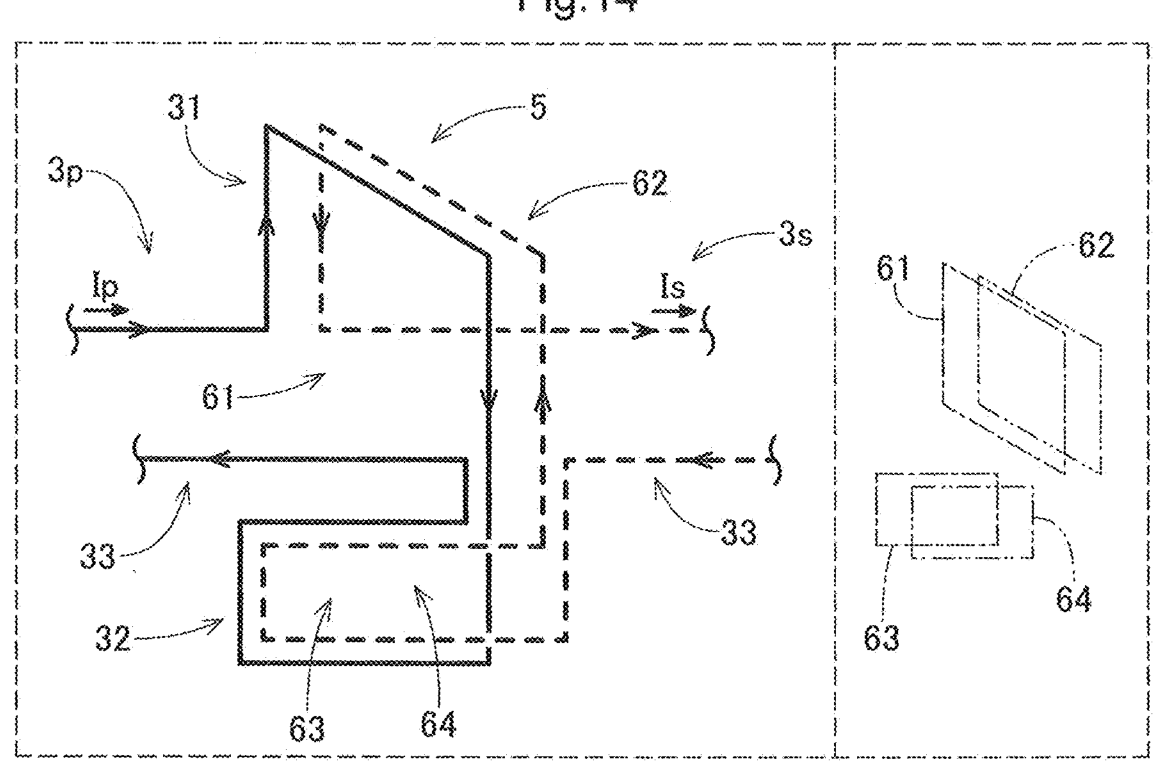
FIG. 14 is a diagram of the first feed line and the second feed line arranged in a fifth example.

More specifically, in the first to fifth examples, the first sections 31 in each of the first feed line 3*p* and the second feed line 3*s* are included in a plane, and the second section 32 in each of the first feed line 3*p* and the second feed line 3*s* is included in a plane. As shown in FIGS. 13 and 14, a first plane 61 includes the first sections 31 of the first feed line 3*p*. A second plane 62 includes the first sections 31 of the second feed line 3*s*. A third plane 63 includes the second section 32 of the first feed line 3*p*. A fourth plane 64 includes the second section 32 of the second feed line 3*s*. In the first to fifth examples, the first plane 61 and the second plane 62 are parallel to each other, and the third plane 63 and the fourth plane 64 are parallel to each other. In the fourth example and the fifth example, the third plane 63 and the fourth plane 64 are perpendicular to the first plane 61 and the second plane 62. In this example, two planes are parallel to each other when the angle between one plane and the other is within 20 degrees and are perpendicular to each other when the angle between one plane and the other is within 20 degrees from a right angle (the acute angle is 70 degrees or more).

Figure 15:
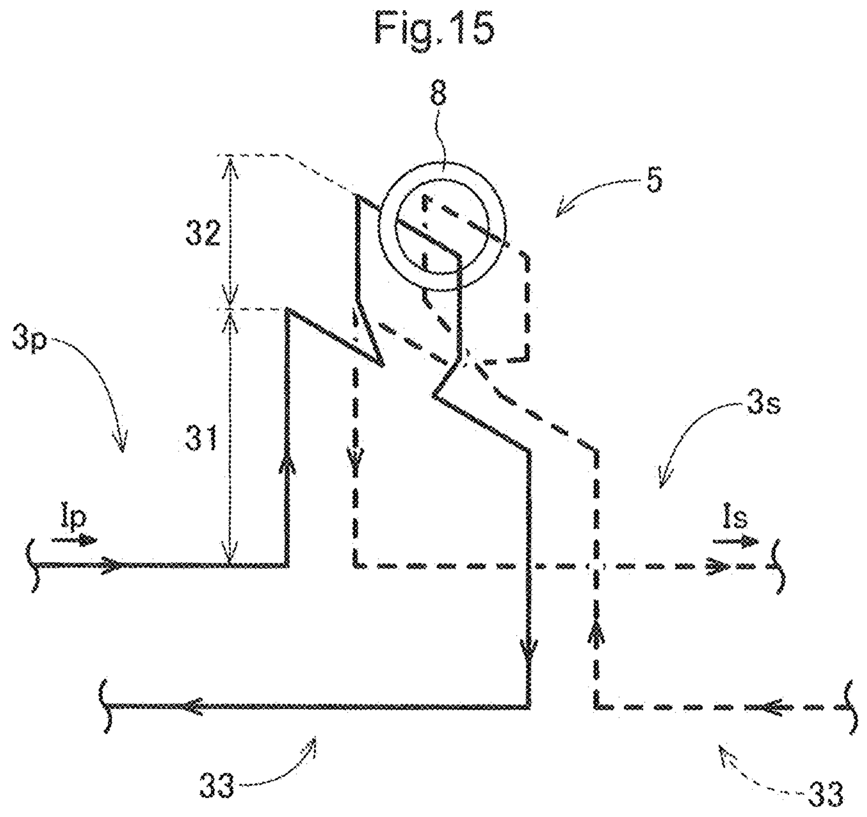
FIG. 15 is a diagram of the first feed line and the second feed line arranged in a sixth example.
Figure 16:
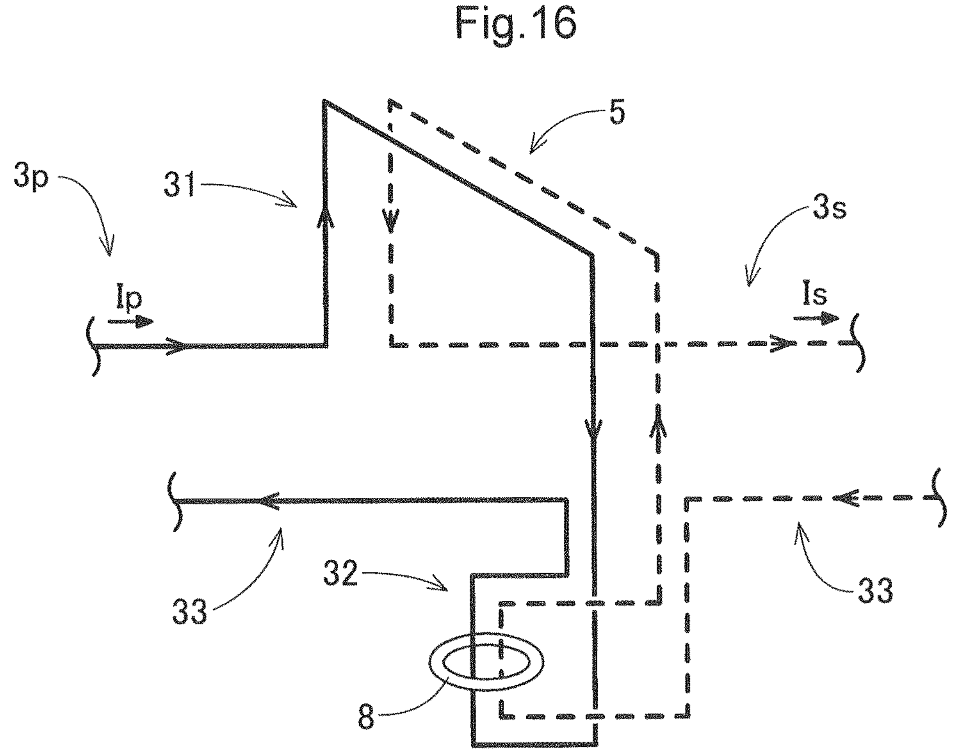
FIG. 16 is diagram of the first feed line and the second feed line arranged in a seventh example.

As in the sixth example shown in FIG. 15 and the seventh example shown in FIG. 16, the coupler 5 may include a magnetic core 8 that forms a magnetic path surrounding the second section 32 of the first feed line 3*p* and the second section 32 of the second feed line 3*s* as a pair of feed lines. The structure including the magnetic core 8 can increase the second mutual inductances M2 in the second sections 32 more than the structure including the feed lines 3 alone. This allows the second section 32 in each of the first feed line 3*p* and the second feed line 3*s* to be shorter, with an intended level of the second mutual inductance M2 being maintained. The size of the coupler 5 can thus be easily reduced while substantially the same reduction level of interference power is maintained.

Typically, the first current Ip and the second current Is are designed to be synchronized substantially, but not completely. In other words, the contactless power feeder 100 is started typically with the currents in synchronization, which may subsequently be out of synchronization. While the first current Ip and the second current Is are substantially in synchronization, the first sections 31 can be in the opposite phases in which the first current Ip and the second current Is flow in substantially opposite directions. In contrast, the second sections 32 can be in phase in which the first current Ip and the second current Is flow in the substantially same direction.

Figure 17:
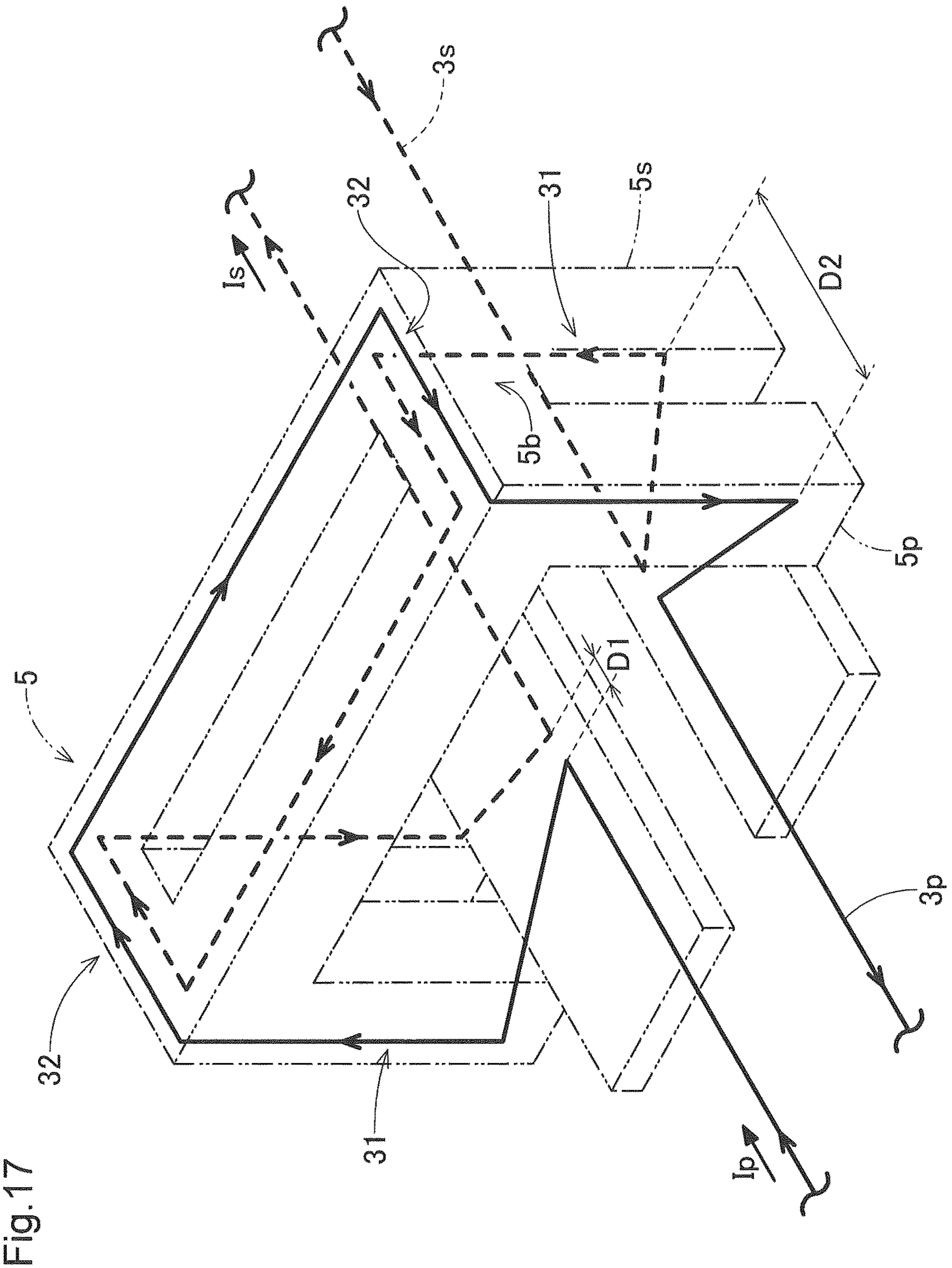
FIG. 17 is a diagram of example wiring of the feed lines in a coupler.

FIG. 17 is a schematic diagram of a coupler 5, showing the structure with the advantageous effects described with reference to the first to seventh examples. The coupler 5 has the first portion 5*p* and the second portion 5*s* spaced from each other, unlike the known coupler 5 (refer to FIG. 4). The second distance D2 can thus be left between each second joint 36 in the first feed line 3*p* and the corresponding second joint 36 in the second feed line 3*s*, as described above with reference to FIGS. 10 to 12. Although the planes are shown without reference sings in FIG. 17, the planes (the first plane 61 and the second plane 62) including the first sections 31 of the feed lines 3 are perpendicular to the planes (the third plane 63 and the fourth plane 64) including the second sections 32 of the feed lines 3. In this structure, the magnetic flux induced by the current through the first sections 31 is less likely to interfere with the magnetic flux induced by the current through the second sections 32.

The coupler 5 may also hold the magnetic core 8 in the portions holding the second section 32 of the first feed line 3*p* and the second section 32 of the second feed line 3*s*. More specifically, the magnetic core 8 may be accommodated in a bridge 5*b* connecting the first portion 5*p* to the second portion 5*s* to allow the second section 32 of the first feed line 3*p* and the second section 32 of the second feed line 3*s* held by the coupler 5 to extend radially inward from the magnetic core 8. This design uses the structure of the known coupler 5 while allowing the feed lines 3 to be arranged and held more appropriately. This allows construction of the contactless power feeder 100 without synchronizing the currents flowing through the feed lines 3. The coupler 5 in the present embodiment is used relatively easily in, for example, existing contactless power feeders 100.

As described above with various embodiments, the structure in the present embodiment can reduce interference power independently of a phase difference between the first current Ip and the second current Is without including a synchronization circuit system such as a circuit for synchronizing the first current Ip and the second current Is and its accessory cables, and stably feed power from the power supply 2 in each power feeding system 1. In other words, the contactless power feeder 100 can be smaller with no synchronization circuit system being included.

The mutual inductance can be predicted based on the length of the feed lines 3 routed in the coupler 5. The first mutual inductance M1 and the second mutual inductance M2 can thus be set to similar values without involving, for example, complex calculation. With the second mutual inductance M2 defined, the length of the second section 32 can be easily set at the design stage.

When the second distance D2 is larger than the first distance D1 as in the second example and the third example, the first mutual inductance M1 can be lower, with the second mutual inductance M2 also being lower. This allows the second section 32 to be shorter. When the first mutual inductance M1 is lower, the unintended first induction voltage Vp may also be lower. The lower first induction voltage Vp can reduce the electric load on the power supply 2, thus easily increasing the power feed distance from the power supply 2. In other words, the feed lines 3 in each power feeding system 1 can be longer easily.

As in the second, third, fourth, and fifth examples, when the planes (the first plane 61 and the second plane 62) including the first sections 31 of the feed lines 3 are perpendicular to the planes (the third plane 63 and the fourth plane 64) including the second sections 32 of the feed lines 3 (when the angle between the planes is within about 20 degrees), the magnetic flux induced by the current through the first sections 31 is less likely to interfere with the magnetic flux induced by the current through the second sections 32, effectively reducing interference power. As in the sixth and seventh examples, with the magnetic core 8, the second sections 32 can further be shorter. The coupler 5 having the structure according to an embodiment shown in FIG. 17 produces all the advantageous effects described above.

In the vector diagrams in FIG. 7 described above, the power supplies 2 shown in FIG. 3 perform capacitive adjustment to feed current to the feed lines 3. However, the power supplies 2 may perform inductive adjustment or resistive adjustment, instead of capacitive adjustment. For such other adjustment methods, vector diagrams corresponding to those described with reference to FIG. 7 will be briefly described with reference to FIG. 18.

The feed lines 3 in one power feeding system 1 form a closed circuit having electrically sufficiently long transmission lines, and thus serve as a distributed constant circuit. The feed lines 3 have an impedance defined by resistance, inductance, or capacitance expected to be distributed on the circuit. The impedance in the power feeder circuit including the feed lines 3 and the power supply 2 is likely to be affected further by, for example, mutual inductance induced by coupling between the feed lines 3 and the pickup coils 40 in the power receiver 4 in the article transport vehicle 30 and mutual inductance induced by coupling, in the coupler 5, with the feed lines 3 in the adjacent power feeding systems 1.

Each power supply 2 is expected to appropriately (electrically efficiently) feed power to the power receiver 4 in the article transport vehicle 30 through the feed lines 3 connected to the corresponding power supply 2. The power receiver 4 includes a resonator circuit that resonates with the frequency of the high-frequency current flowing through the feed lines 3. When the impedance in the power feeder circuit including the feed lines 3 deviates from an impedance (predetermined impedance) that allows efficient power feeding, the feeding efficiency decreases with increased loss. Thus, the impedance in the power feeder circuit in each power feeding system 1 may be adjusted appropriately.

The impedance includes capacitance, inductance, and resistance. The impedance in the power feeder circuit can thus be adjusted by adjusting the constants of one or more of the capacitance, the inductance, or the resistance. For example, each power supply 2 may include a capacitor array to adjust the impedance in the power feeder circuit by varying the capacitance. FIG. 7 is a set of vector diagrams when the impedance in the power feeder circuit is adjusted capacitively. However, the impedance in the power feeder circuit may be adjusted inductively or resistively.

Figure 18:
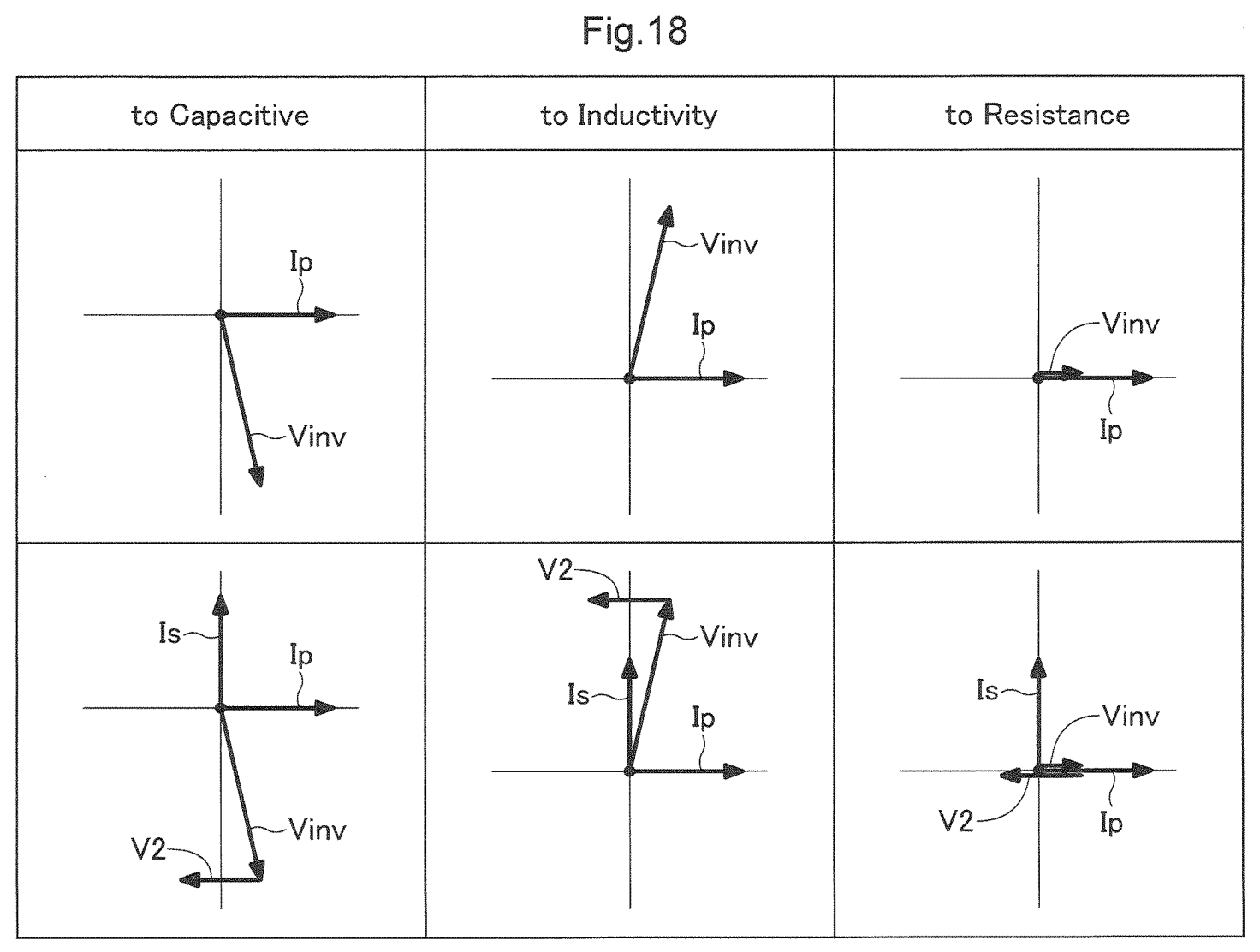

FIG. 18 shows vector diagrams (left) in which capacitive adjustment is performed as in the example in FIG. 7, vector diagrams (middle) in which inductive adjustment is performed, and vector diagrams (right) in which resistive adjustment is performed, for the vector diagram of Is: −90° in FIG. 7 (in which the second current Is has the phase lagging by 90 degrees from the synchronization phase). The compensated output voltage Vinv2, which is the composite vector of the reference output voltage Vinv and the mutual induction voltage V2, is not shown in FIG. 18. As shown in FIG. 18, for the inductive adjustment and the resistive adjustment, the interference voltage can be, similarly to the capacitive adjustment, beyond the imaginary axis when, for example, the electric loads receiving power from the first feed lines 3*p* consume less power. In this case, the regenerated power for the power supplies 2 connected to the first feed lines 3*p* may cause abnormalities in the power supplies 2, such as an overvoltage. In other words, interference voltage causes issues independently of the specifications of the power supplies 2, such as using capacitive, inductive, or resistive adjustment. Thus, the technique for effectively arranging the feed lines 3 in the coupler 5 described above is applicable to power supplies 2 with any specifications.

Figure 19:
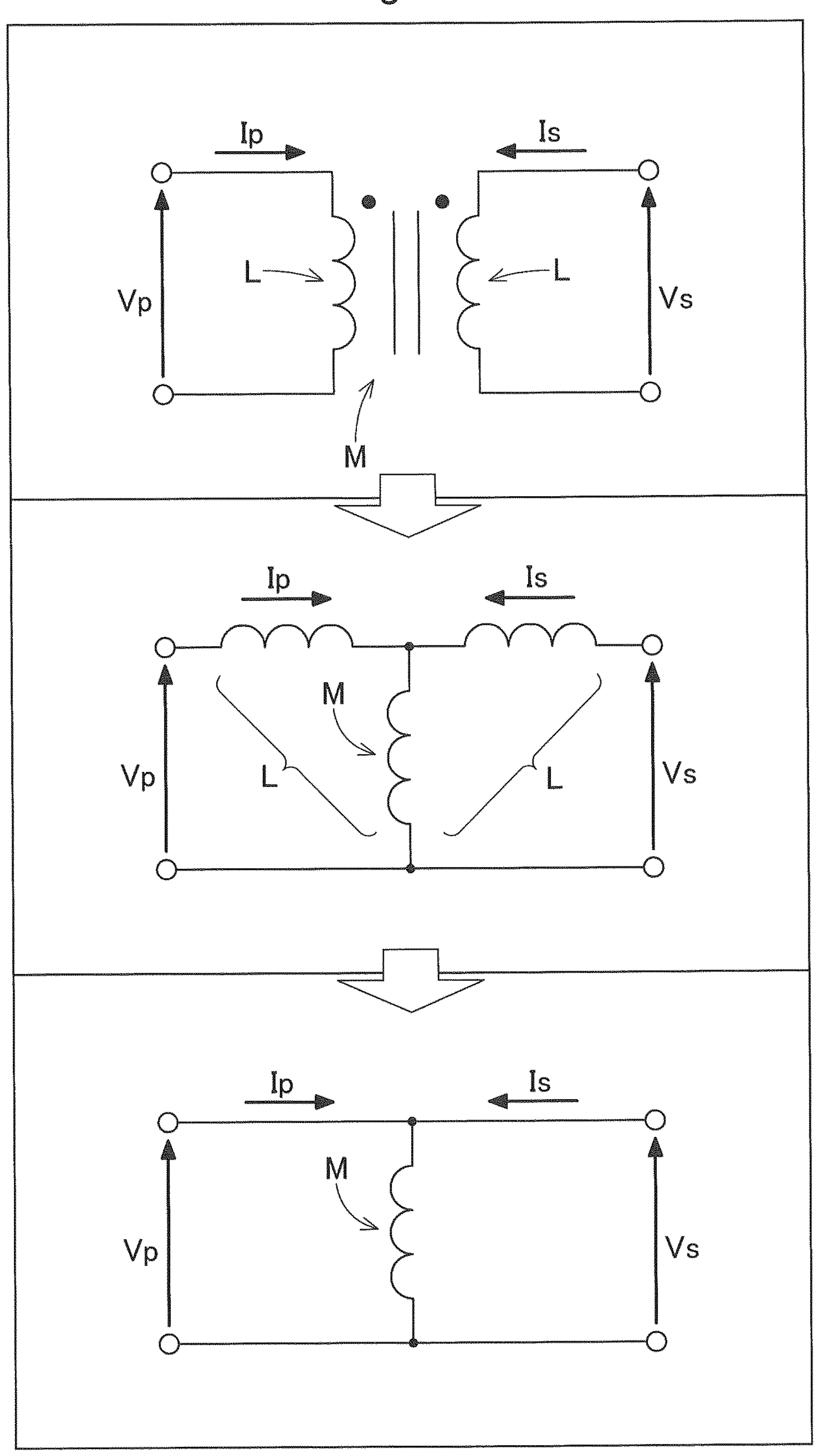
FIG. 19 is a diagram of a transformer coupling circuit modified to a modified T-topology circuit through a T-topology circuit.

Formula 1 will now be described further. As described above, Formula 1 is defined based on the modified T-topology circuit (the lower circuit in FIG. 19). The modified T-topology circuit will now be described with reference to FIG. 19. The equivalent circuit shown at the upper section of FIG. 19 is a typical equivalent circuit of a transformer corresponding to the equivalent circuit in FIG. 5. As in FIG. 5, M is the mutual inductance between the pair of feed lines 3 in the coupler 5, and L is the self-inductance that is the total of leakage inductance and the mutual inductance M in the feed lines 3. The equivalent circuit can be the T-topology circuit shown in the middle section of FIG. 19. The T-topology circuit includes the leakage inductance (the inductance shown in the arms of the T shape in the T-topology circuit), and has an interterminal voltage Vp expressed by Formula 4 below. As described above with reference to Formula 1, V1 is the voltage (self-induction voltage) induced by the self-inductance L, and V2 is the voltage (mutual induction voltage) induced by the mutual inductance M.

$$Vp = j\omega L \cdot Ip + j\omega M \cdot Is = V1 + V2 \quad (4)$$

The inductance of each feed line 3 connected to the power supply 2 is far higher than the leakage inductance of the coupler 5. Thus, for electromagnetic coupling in the coupler 5 as in the present embodiment, the leakage inductance can be included in the inductance of the feed lines 3, and thus the T-topology circuit can be modified to the modified T-topology circuit that has the mutual inductance M alone, as shown in the lower section of FIG. 19. This allows Formula 4 to be expressed using the mutual inductance M alone, as in Formula 5.

$$Vp = j\omega M \cdot Ip + j\omega M \cdot Is = V1 + V2 \quad (5)$$

The equivalent circuit in FIG. 5 schematically shows electromagnetic coupling between the first feed line 3*p* and the second feed line 3*s* in the coupler 5, with the first current Ip and the second current Is being synchronized. More specifically, in the equivalent circuit in FIG. 5, the first current Ip and the second current Is have opposite phases. The second current Is in Formula 5 is thus expressed as—Is to invert the value sign in the second term in Formula 5. Formula 1 is thus be obtained.

An overview of the contactless power feeder described above is briefly provided below.

A contactless power feeder in response to the above is a contactless power feeder for supplying power contactlessly to a power receiver included in a movable body. The contactless power feeder includes a plurality of feed lines aligned along a travel path for the movable body and including a first feed line and a second feed line adjacent to the first feed line along the travel path, a plurality of power supplies each connected to a corresponding feed line of the plurality of feed lines to supply alternating current to the corresponding feed line, and a coupler disposed between the first feed line and the second feed line and holding the first feed line and the second feed line. The coupler holds a first section and a second section of each of the first feed line and the second feed line facing each other. The first feed line and the second feed line are arranged in the coupler to cause a direction of a current through the first section of the second feed line relative to a direction of a current through the first section of the first feed line to be opposite to a direction of a current through the second section of the second feed line relative to a direction of a current through the second section of the first feed line.

This structure can reduce interference power using an induced electromotive force between the first feed line and the second feed line facing each other in the coupler, although the alternating current through the first feed line has a phase shifted from the phase of the alternating current through the second feed line. This reduces the likelihood of abnormalities in the power supply connected to each feed line. Thus, the contactless power feeder with this structure may not have synchronized phases between the alternating current through the first feed line and the alternating current through the second feed line, and thus includes no synchronization system. In other words, the structure provides the contactless power feeder including multiple feed lines with reduced interference power between adjacent feed lines using systems with simpler structures than known systems. The contactless power feeder can thus be simpler and less costly.

In the contactless power feeder, the first feed line and the second feed line may be arranged in the coupler to cause a first mutual inductance to be substantially equal to a second mutual inductance. The first mutual inductance is a mutual inductance between the first section of the first feed line and the first section of the second feed line. The second mutual inductance is a mutual inductance between the second section of the first feed line and the second section of the second feed line.

This structure can markedly reduce interference power from an induced electromotive force between the first feed line and the second feed line facing each other in the coupler.

In the contactless power feeder, each of the first feed line and the second feed line may include a feed section along the travel path outside the coupler. The feed section may be directly connected to a first joint of the first section. The second section may be connected to a second joint of the first section and connected to the feed section through the first section. The second joint may be different from the first joint. The feed section of the first feed line and the feed section of the second feed line may be aligned along the travel path. The first feed line and the second feed line may be arranged in the coupler to cause a distance between the second joint in the first feed line and the second joint in the second feed line to be larger than a distance between the first joint in the first feed line and the first joint in the second feed line.

In this structure, the first feed line and the second feed line are arranged to cause the distance between the first joints to be smaller than the distance between the second joints. This can reduce the gap between adjacent feed lines at each interconnection between the feed lines, thus allowing appropriate power feeding to the movable body. Further, when the first feed line and the second feed line are arranged to cause the distance between the second joints to be larger than the distance between the first joints, the induced electromotive force between the first feed line and the second feed line can be reduced. This facilitates shortening of the second section and reduction of an induced electromotive force in the first section and the second section. The interference power can be reduced easily, thus easily increasing the effective length of the feed lines that can receive power from the power supply.

In the contactless power feeder, the first section and the second section in each of the first feed line and the second feed line may each be included in a plane. A first plane including the first section of the first feed line may be parallel to a second plane including the first section of the second feed line. A third plane including the second section of the first feed line may be parallel to a fourth plane including the second section of the second feed line. The first plane and the second plane may be perpendicular to the third plane and the fourth plane.

This structure facilitates reduction of an induced electromotive force between the first feed line and the second feed line, thus effectively reducing interference power easily.

In the contactless power feeder, each of the first feed line and the second feed line may include a feed section along the travel path outside the coupler. The feed section may be directly connected to a first joint of the first section. The second section may be connected to a second joint of the first section and connected to the feed section through the first section. The second joint may be different from the first joint. The coupler may further include a magnetic core that forms a magnetic path surrounding the second section of the first feed line and the second section of the second feed line.

The structure including the magnetic core facilitates shortening the second section of the first feed line and the second section of the second feed line. The size of the coupler can thus be easily reduced while substantially the same reduction level of interference power is maintained.

What is claimed is:

1. A contactless power feeder for supplying power contactlessly to a power receiver included in a movable body, the contactless power feeder comprising:

a plurality of feed lines aligned along a travel path for the movable body, the plurality of feed lines comprising a first feed line and a second feed line adjacent to the first feed line along the travel path;

a plurality of power supplies each connected to a corresponding feed line of the plurality of feed lines to supply alternating current to the corresponding feed line;

a plurality of power feeding systems aligned along the travel path, the plurality of power feeding systems including a first power feeding system formed as a closed circuit comprising the first feed line that is one of the plurality of feed lines and a first power supply that is one of the plurality of power supplies and a second power feeding system formed as a closed circuit comprising the second feed line that is one of the plurality of feed lines and a second power supply that is one of the plurality of power supplies; and a coupler disposed between the first feed line and the second feed line and holding the first feed line and the second feed line, the coupler holding a first section and a second section of each of the first feed line and the second feed line facing each other, and wherein the first feed line and the second feed line are arranged in the coupler to cause a direction of a current through the first section of the second feed line relative to a direction of a current through the first section of the first feed line to be opposite to a direction of a current through the second section of the second feed line relative to a direction of a current through the second section of the first feed line.

2. The contactless power feeder according to claim 1, wherein:

the first feed line and the second feed line are arranged in the coupler to cause a first mutual inductance to be substantially equal to a second mutual inductance, the first mutual inductance is a mutual inductance between the first section of the first feed line and the first section of the second feed line, and the second mutual inductance is a mutual inductance between the second section of the first feed line and the second section of the second feed line.

3. The contactless power feeder according to claim 1, wherein:

each of the first feed line and the second feed line comprises a feed section along the travel path outside the coupler, the feed section is directly connected to a first joint of the first section, the second section is connected to a second joint of the first section and connected to the feed section through the first section, and the second joint is different from the first joint, the feed section of the first feed line and the feed section of the second feed line are aligned along the travel path, and the first feed line and the second feed line are arranged in the coupler to cause a distance between the second joint in the first feed line and the second joint in the second feed line to be larger than a distance between the first joint in the first feed line and the first joint in the second feed line.

4. The contactless power feeder according to claim 1, wherein:

the first section and the second section in each of the first feed line and the second feed line are each included in a plane, a first plane including the first section of the first feed line is parallel to a second plane including the first section of the second feed line, a third plane including the second section of the first feed line is parallel to a fourth plane including the second section of the second feed line, and the first plane and the second plane are perpendicular to the third plane and the fourth plane.

5. The contactless power feeder according to claim 1, wherein:

each of the first feed line and the second feed line comprises a feed section along the travel path outside the coupler, the feed section is directly connected to a first joint of the first section, the second section is connected to a second joint of the first section and connected to the feed section through the first section, and the second joint is different from the first joint, and the coupler comprises a magnetic core configured to form a magnetic path surrounding the second section of the first feed line and the second section of the second feed line.

6. A contactless power feeder for supplying power contactlessly to a power receiver included in a movable body, the contactless power feeder comprising:

a plurality of feed lines aligned along a travel path for the movable body, the plurality of feed lines comprising a first feed line and a second feed line adjacent to the first feed line along the travel path;

a plurality of power supplies each connected to a corresponding feed line of the plurality of feed lines to supply alternating current to the corresponding feed line;

a plurality of power feeding systems aligned along the travel path, the plurality of power feeding systems including a first power feeding system formed as a closed circuit comprising the first feed line that is one of the plurality of feed lines and a first power supply that is one of the plurality of power supplies and a second power feeding system formed as a closed circuit comprising the second feed line that is one of the plurality of feed lines and a second power supply that is one of the plurality of power supplies; and a coupler disposed between the first feed line and the second feed line and holding the first feed line and the second feed line, the coupler holding a first section and a second section of each of the first feed line and the second feed line facing each other, and wherein the first feed line and the second feed line are arranged in the coupler to cause a direction of a current through the first section of the second feed line relative to a direction of a current through the first section of the first feed line to be opposite to a direction of a current through the second section of the second feed line relative to a direction of a current through the second section of the first feed line, the first section and the second section in each of the first feed line and the second feed line are each included in a plane, a first plane including the first section of the first feed line is parallel to a second plane including the first section of the second feed line, and a third plane including the second section of the first feed line is parallel to a fourth plane including the second section of the second feed line.

7. A contactless power feeder for supplying power contactlessly to a power receiver included in a movable body, the contactless power feeder comprising:

a plurality of feed lines aligned along a travel path for the movable body, the plurality of feed lines comprising a first feed line and a second feed line adjacent to the first feed line along the travel path;

a plurality of power supplies each connected to a corresponding feed line of the plurality of feed lines to supply alternating current to the corresponding feed line; and a coupler disposed between the first feed line and the second feed line and holding the first feed line and the second feed line, the coupler holding a first section and a second section of each of the first feed line and the second feed line facing each other, and wherein the first feed line and the second feed line are arranged in the coupler to cause a direction of a current through the first section of the second feed line relative to a direction of a current through the first section of the first feed line to be opposite to a direction of a current through the second section of the second feed line relative to a direction of a current through the second section of the first feed line, the first section and the second section in each of the first feed line and the second feed line are each included in a plane, a first plane including the first section of the first feed line is parallel to a second plane including the first section of the second feed line, a third plane including the second section of the first feed line is parallel to a fourth plane including the second section of the second feed line, and the first plane and the second plane are perpendicular to the third plane and the fourth plane.

* * * * *